United States Patent
Leeser

(10) Patent No.: US 9,443,722 B1
(45) Date of Patent: Sep. 13, 2016

(54) CYCLICAL, NON-ISOBARIC, PORE SEALING METHOD TO PREVENT PRECURSOR PENETRATION INTO THE SUBSTRATE

(71) Applicant: Lam Research Corporation, Fremont, CA (US)

(72) Inventor: Karl F. Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/675,701

(22) Filed: Mar. 31, 2015

(51) Int. Cl.
*H01L 21/31* (2006.01)
*H01L 21/02* (2006.01)

(52) U.S. Cl.
CPC ..... *H01L 21/02315* (2013.01); *H01L 21/0228* (2013.01); *H01L 21/02175* (2013.01); *H01L 21/02183* (2013.01); *H01L 21/02186* (2013.01); *H01L 21/02203* (2013.01); *H01L 21/02266* (2013.01); *H01L 21/02271* (2013.01)

(58) Field of Classification Search
CPC ............... H01L 21/0212; H01L 21/02123; H01L 21/02126; H01L 21/02337; H01L 21/0234; H01L 21/02351; H01L 21/02348; H01L 21/0228
USPC ............ 438/623, 638, 648, 761, 780, 781
See application file for complete search history.

(56) References Cited

U.S. PATENT DOCUMENTS

| 7,901,743 B2 * | 3/2011 | Lee .................. H01L 21/02063 250/492.21 |
| 8,338,315 B2 * | 12/2012 | Moore ....................... C08J 3/24 257/E21.277 |
| 2007/0077751 A1 * | 4/2007 | Chen ................ H01L 21/02107 438/622 |

* cited by examiner

*Primary Examiner* — Brook Kebede
(74) *Attorney, Agent, or Firm* — Martine Penilla Group, LLP

(57) ABSTRACT

A method for processing a substrate using a plasma chamber. The method includes providing the substrate on a pedestal of the plasma chamber, the substrate having a material layer that has a porous structure and a least one feature formed in the material layer that exposes one or more open pores of the porous structure. The method further includes introducing an inert gas into the plasma chamber so that a pressure of the plasma chamber is increased to a first pressure that is higher than an average process pressure used for depositing a thin film, wherein increasing to the first pressure causes at least some of the inert gas to migrate into the one or more open pores of the porous structure of the material layer and decreasing the pressure of the plasma chamber to a second pressure that is lower than the average process pressure used for depositing the thin film, wherein decreasing the pressure to the second pressure causes at least some of the inert gas in the material layer to outgas from the one or more open pores. The method then includes depositing the thin film over the material layer and the feature formed in the material layer simultaneously while the inert gas outgases from the one or more open pores of the material layer to seal the one or more open pores while the inert gas outgases.

19 Claims, 7 Drawing Sheets

CYCLICAL, NON-ISOBARIC, PORE SEALING METHOD TO PREVENT PRECURSOR PENETRATION INTO THE SUBSTRATE

BACKGROUND

1. Field of the Invention

The present embodiments relate to semiconductor wafer processing methods and equipment tools, and more particularly, to deposition of thin films used in sealing open pores of a porous dielectric material.

2. Description of the Related Art

Some semiconductor processing systems may employ plasma when depositing thin films on a substrate in a processing chamber. Generally, the substrate is arranged on a pedestal in the processing chamber. To create the thin film using chemical vapor deposition, one or more precursors are supplied by a showerhead to the processing chamber.

During processing, radio frequency (RF) power may be supplied to the showerhead or to an electrode to create plasma. For example, RF power may be supplied to the electrode embedded in a pedestal platen, which may be made of a non-conducting material such as ceramic. Another conducting portion of the pedestal may be connected to RF ground or another substantially different electrical potential.

When the electrode is excited by the RF power, RF fields are generated between the substrate and the showerhead to create plasma between the wafer and the showerhead. Plasma-enhanced chemical vapor deposition (PECVD) is a type of plasma deposition that is used to deposit thin films from a gas state (i.e., vapor) to a solid state on a substrate such as a wafer. PECVD systems convert a liquid precursor into a vapor precursor, which is delivered to a chamber. Such thin films can be deposited over various substrate materials, which may include previously etched features. Some materials, such as low-K ("K" being a dielectric constant) materials, may have a pore structure. The etched features, therefore, will produce open and exposed pores inside the features, e.g., feature walls.

Various methods exist to deposit thin films over the open, exposed pores inside features. Inevitably, the vapor precursors and atoms of the precursors used in such processing penetrate into the material through the largely interconnected pores altering their electrical properties. Such alteration may, for example, inadvertently increase the effective relative dielectric constant (i.e., the "K" value") of the material. Unfortunately, even the solid thin film ends up penetrating into the underlying porous material instead of remaining close to the surface of the feature.

It is in this context that inventions arise.

SUMMARY

Embodiments of the disclosure provide a cyclical process for depositing a pore sealing material by depositing while simultaneously reducing the pressure to allow the porous low-k material to outgas, reducing the penetration of the sealant into the pores. Using the disclosed cyclical, non-isobaric process, one advantage is an ability to leverage transient flow processes to create an intentional gas flow out of the porous substrate to combat the natural diffusion of chemical precursor vapor into said pores. This mechanic is significantly different from conventional continuum, steady flow pore sealing processes.

A method for processing a substrate using a plasma chamber. The method includes providing the substrate on a pedestal of the plasma chamber, the substrate having a material layer that has a porous structure and a least one feature formed in the material layer that exposes one or more open pores of the porous structure. The method further includes introducing an inert gas into the plasma chamber so that a pressure of the plasma chamber is increased to a first pressure that is higher than an average process pressure used for depositing a thin film, wherein increasing to the first pressure causes at least some of the inert gas to migrate into the one or more open pores of the porous structure of the material layer and decreasing the pressure of the plasma chamber to a second pressure that is lower than the average process pressure used for depositing the thin film, wherein decreasing the pressure to the second pressure causes at least some of the inert gas in the material layer to outgas from the one or more open pores. The method then includes depositing the thin film over the material layer and the feature formed in the material layer simultaneously while the inert gas outgases from the one or more open pores of the material layer to seal the one or more open pores while the inert gas outgases.

In some embodiments the thin film is a metallic film for sealing the one or more open pores, and the method further comprising repeating, the increasing in pressure, the decreasing in pressure and the deposition one or more additional cycles, such that each cycle produces a thin film having a thickness of two or more thin films to seal the one or more open pores in the feature of the material layer.

In some embodiments, the material layer is a low-K dielectric material, and the one or more pores are distributed throughout the material layer and in specific examples, the material layer is silicon oxycarbide (SiOC).

In some embodiments, the thin film is a dielectric film for sealing the one or more open pores; and the method further includes depositing a metallic film over the dielectric film. The metallic film is deposited using one of a physical vapor deposition (PVD) method, a chemical vapor deposition (CVD) method or atomic layer deposition (ALD) method, such that the metallic film is deposited after the one or more pores have been sealed by the dielectric film.

In other embodiments, the thin film is a metallic film defined from one of a tantalum nitride (TaN), a titanium nitride (TiN), or a tungsten nitride (WN), and metallic film is formed via a chemical process implementing a chemical vapor deposition (CVD) or atomic layer deposition (ALD).

In some embodiments, the porous structure of the material layer defines a level of hydraulic resistance to absorbing the inert gas during the increase of the pressure to the first pressure. The level of hydraulic resistance defines an amount of time during a period of increasing the pressure to the first pressure and an amount of increase beyond the average process pressure.

DESCRIPTION

Figure 1:
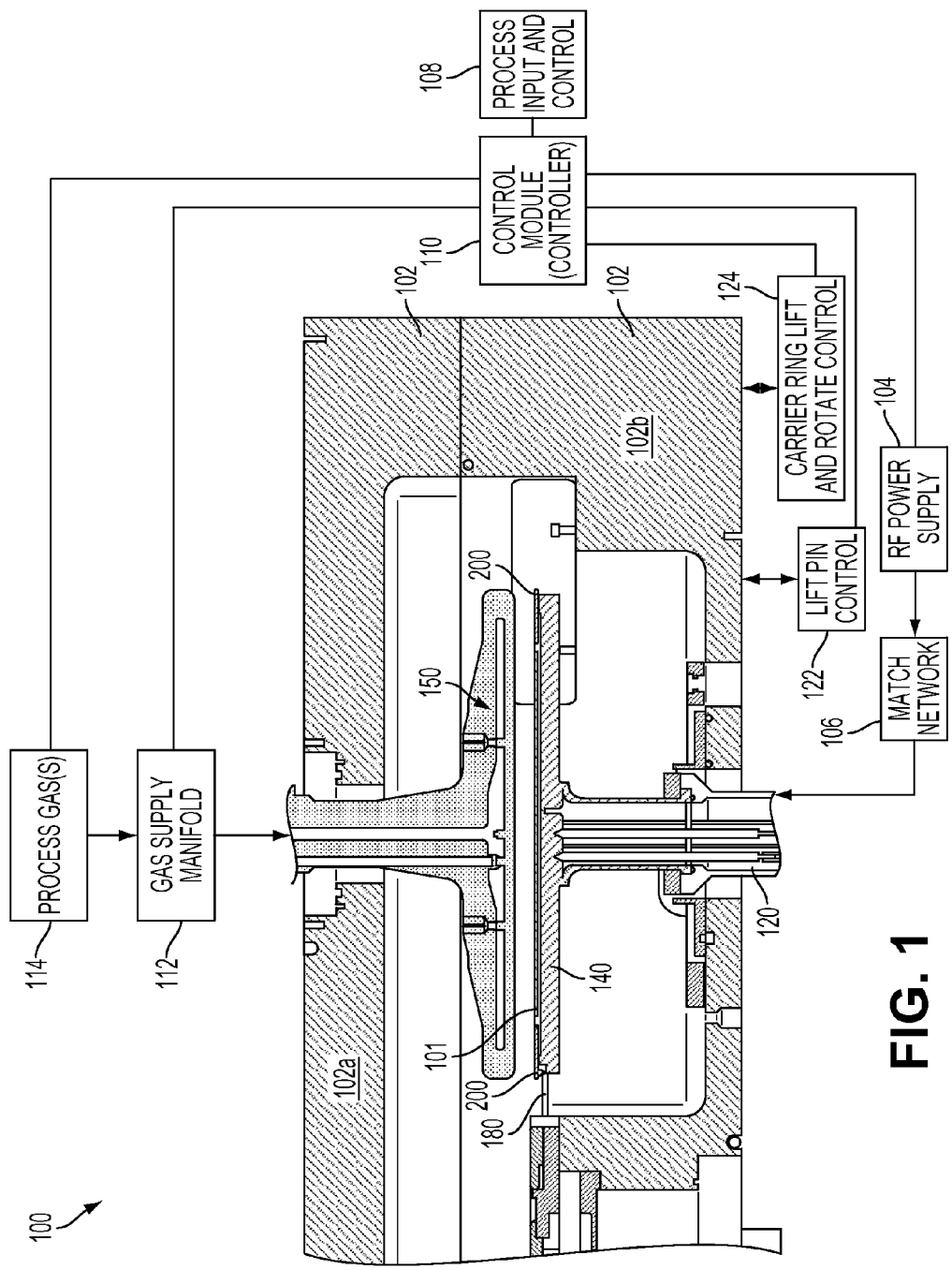
FIG. 1 illustrates a substrate processing system, which is used to process a wafer, e.g., to form films thereon.

Embodiments of the disclosure provide a cyclical process for depositing a pore sealing material by depositing while simultaneously reducing the pressure to allow the porous low-k material to outgas, reducing the penetration of the sealant into the pores.

In one embodiment, the cyclical process of depositing may include the following operations. In step one, the absolute pressure in the reactor is increased using an ambient that is inert to a subsequent thin film pore sealing method. The pressure increases to a first pressure that is higher than the average processing pressure of the subsequent thin film pore sealing method. At this point, ambient gas diffuses into the pores in the substrate. In step two, the pressure is then rapidly reduced to a second pressure that is below the average processing pressure of the subsequent thin film pore sealing method. In step three, the pore sealing method initiates and proceeds for a specified period. During this period, ambient gas outgasses from (flows back out of) the substrate simultaneously with a deposition of the pore sealing thin film. At the end of step three, the thin film pore sealing method temporarily stops and cycles back to step one. In this example, steps one to three comprise the cyclical pore sealing process that is repeated until the desired film thickness or continuity is reached.

The flow of gas out of the pores in step two prevents the vapor precursors used in the thin film pore sealing methods from substantially penetrating into the substrate, thus preserving the desirably of a low dielectric constant of the substrate. As another advantage, cyclical pore sealing also helps the thin film to be located at the surface of the feature (e.g., bridging the pore) and not penetrate into the exposed pores on the surface of the feature.

In the examples provided in this disclosure, mention is made regarding deposition processes. Some deposition processes will utilize different types of deposition chambers and equipment. In general, the deposition chambers should be capable of pressure increases and decreases, so as to facilitate the penetration of inert gases into a porous material with open pores and outgas during a pressure drop. Accordingly, the following examples of chambers should be viewed as just that, examples.

Deposition of films may be implemented in a plasma enhanced chemical vapor deposition (PECVD) system. The PECVD system may take many different forms. A PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations. It should be appreciated that the present embodiments can be implemented in numerous ways, such as a process, an apparatus, a system, a device, or a method. Several embodiments are described below.

FIG. 1 illustrates a substrate processing system 100, which is used to process a wafer 101. The system includes a chamber 102 having a lower chamber portion 102b and an upper chamber portion 102a. A center column is configured to support a pedestal 140, which in one embodiment is a powered electrode. The pedestal 140 is electrically coupled to power supply 104 via a match network 106. The power supply 104 may be defined from a single generator having two or more selectable and mutually exclusive oscillators. The power supply 104 is controlled by a control module 110, e.g., a controller. The control module 110 is configured to operate the substrate processing system 100 by executing process input and control 108. The process input and control 108 may include process recipes, such as power levels, timing parameters, process gasses, mechanical movement of the wafer 101, etc., such as to deposit or form films over the wafer 101.

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 150 and distributed in a space volume defined between the showerhead 150 face which faces that wafer 101 and the wafer 101 resting over the pedestal 140.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by forks 180. The carrier ring 200 is therefore lifted along with the wafer 101 and can be rotated to another station, e.g., in a multi-station system. In other embodiments, the chamber is a single station chamber. In such construction, the focus ring or edge ring is used, instead of a carrier ring. In either configuration, RF power is supplied to an electrode of the chamber so that a plasma can be generated for deposition. In other configurations, the RF power may be supplied to a plasma used for an etching operation. More detail regarding a cyclical process for depositing a pore sealing material by depositing while simultaneously reducing the pressure to allow the porous low-k material to outgas, while also reducing the penetration of the sealant or atoms of the sealant material/gas into the pores is provided below with reference to FIGS. 2A-5.

Figure 2A:
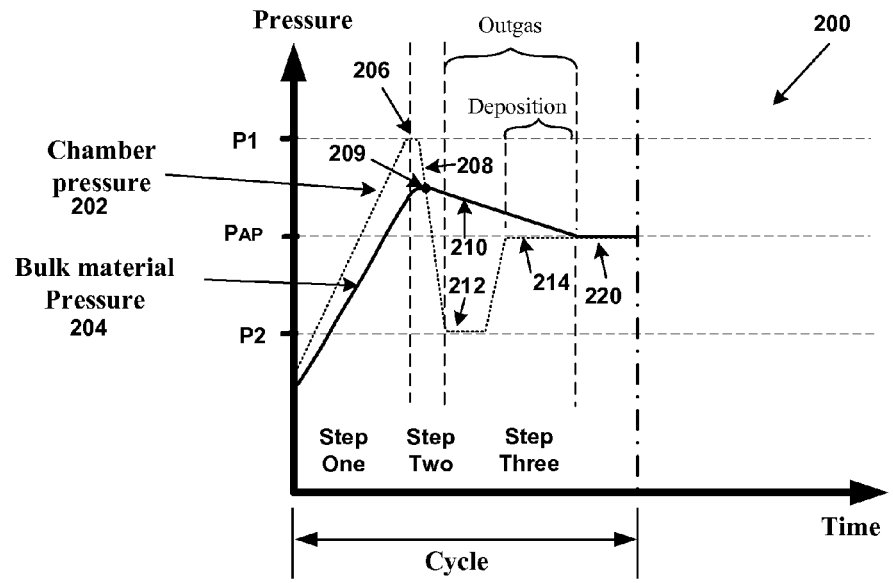
FIGS. 2A and 2B illustrate example graphs showing pressure increases to charge or cause an in-flux of inert gas into a porous structure, decrease in pressure to cause an out-flux of gas, e.g., outgassing, while a deposition process is performed, and the ability to repeat the process in cycles.

FIG. 2A illustrates a diagram 200 according to one embodiment of the present invention. Diagram 200 illustrates the change in chamber pressure 202 to affect the bulk material pressure 204 such that outgassing occurs from the pore structure of a material layer to be deposited in a plasma processing chamber. As used herein, the bulk material pressure 204 refers to the pressure of the material layer of a substrate being processed. As shown, step one includes raising the chamber pressure 202 to a first pressure (P1) that is higher than the average processing pressure ($P_{AP}$). The amount by which the pressure 202 is increased beyond the average processing pressure will be determined based on the properties of the material having the pore structure. For instance, some materials have pore structures that are capable of absorbing more inert gas through open pores than other materials, and such materials would normally track pressure changes to the chamber pressure. However, some materials are less susceptible to absorbing inert gases into the pore structures and therefore the bulk material pressure 204 will not track the chamber pressure as closely, and would produce a lag (i.e., pressure changes in the bulk material will be slower than the pressure changes in the chamber). As described herein, the chamber pressure 202 is increased by pumping the chamber with an inert gas, such as argon (Ar) or nitrogen (N), or other gases that may be inert to the process gases used to deposit thin films.

Continuing with the example of FIG. 2A, the chamber pressure is ramped up a point 206 associated with a first pressure (P1), during step one. At this point, the bulk material pressure 204 will begin to track the pressure of the chamber and will reach a point 209 at a slightly delayed or lagged point from point 206. It should be understood that raising the pressure of the chamber up to point 206 does not necessarily mean that the pressure will be immediately dropped in step two. As the graph is simply one example of many, it is possible that the chamber pressure can be maintained at the pressure P1 for a period of time before the drop in pressure in step two is processed. This being said, the drop in pressure of the chamber 202 begins such that a slope 208 illustrates the drop down to a second pressure (P2), which is lower than the average processing pressure. This brings the pressure down to level 212, which in turn may cause the bulk material pressure 204 to begin to drop at a specific rate illustrated by slope 210. The slope 210 will vary depending on the pore structure of the material. For example, when the pressure of the chamber is dropped to level 212, the bulk material will react such that an outgassing will begin to occur at some point, which reverses the flow of the inert gas out of the open pores of the material layer.

It is believed that the lag of the bulk material pressure to the chamber pressure can be due to a number of related factors related to pore structure, such as pore size and a level of pore interactions. The pore structure will in turn define the level of hydraulic resistance of the material. The hydraulic resistance in turns determines how fast the bulk material can absorb gases and at what elevated pressures and how fast and at what pressures the bulk material can outgases.

The pressure of the chamber can be maintained at level 212 for a period of time or can immediately be brought up to level 214, which is the average processing pressure utilize for depositing a thin film. Once the pressure of the chamber has been brought to level 214, it is believed that the bulk material pressure 204 will continue to decline at some rate because the pressure of the chamber 202 is below the pressure of the bulk material. As a result, the inert gas that was forced or migrated into the open pore structure will begin to outgas. It is believed that the outgassing will continue so long as the chamber pressure 202 is below the bulk material pressure 204. Once the chamber pressure 202 is brought back to the average processing pressure (e.g., set based on the type of film chemistry and recipe), it is possible to perform a deposition while the outgassing is simultaneously occurring. As described above, depositing a thin film while the outgassing is occurring, will allow for a pore sealing process using the thin film being deposited. As such, instead of the thin film material migrating into the pore structure of the material layer, that outgassing will place an outflow pressure near the open pores which will prevent or substantially prevent the thin film from migrating substantially into the pores. As a result, the thin film material will act as a pore sealing mechanism that is aided by the gaseous outflow from the pore structure of the material layer. Thus, step three will include the simultaneous outgassing of the inert gas that was forced into the open pore structure and the deposition while the outgassing is occurring. At some point in time, that outgassing will discontinue, e.g., at point 220, and at such point the deposition may also discontinue.

In one embodiment, each material will have a different pore structure, and the pore structure of the particular material can be tested to determine the rate of absorption of inert gas and the pressures needed to cause the absorption into the open pore structure. Similarly, different materials can be tested and categorized to determine the rate at which gases outflow from the pore structure and the rate associated with such outgassing. By analyzing the specific pore structure of the materials, it is possible to determine the levels of pressure for P1 and P2, and the times during which P1 and P2 must be maintained in order to cause a period of time when outgassing is occurring and the pressure of the chamber is that of the average processing pressure. This in turn will determine the amount of time of deposition available during a cycle. If the time of deposition is not sufficiently long, the cycle may be repeated any number of times depending on the thickness of the thin film needed to be deposited. For instance, some embodiments may result in only part of the open pores being sealed during the deposition portion of a cycle. In such a case, additional cycles may be performed until a sufficient thickness of the thin film has been reached so as to seal the open pores.

In some embodiments, the material layer (i.e., of the bulk material of a substrate) may be is a low-K dielectric material. As used herein, low-K dielectric materials are dielectric materials having a dielectric constant that is less than 4 and greater than 1. In embodiments, the pore structure has pores that are distributed throughout the material layer and in specific examples, the material layer is silicon oxycarbide (SiOC). Although it should be understood that any type of porous material having pores are susceptible to being open may benefit from the cyclic thin film deposition during an outgassing phase of a cycle.

In one embodiments, the thin film being deposited is a dielectric film for sealing the one or more open pores. In such examples, the thin film is designed for pore sealing. For example, if the material layer is a dielectric layer into which metal features are to be formed (e.g. trenches and vias), the dielectric material is typically etched to define trenches and vias that will expose the open pores (e.g. alongside walls and bottom surfaces of the trenches and vias). The dielectric film deposited for sealing the pores that are opened when forming the features in the material layer, will then prevent subsequent metallization layers from entering the pore structure and damaging the low-K dielectric. After the dielectric film is used for sealing the pores, a metallic film deposition may be processed. In this embodiment, the metallic film can be deposited using any one of a physical vapor deposition (PVD) method, a chemical vapor deposition (CVD) method or atomic layer deposition (ALD) method. This is true since the metallic film is deposited after the pores have been sealed by the dielectric film.

In another embodiment, the thin film deposited using the cyclic pore sealing deposition process illustrated in FIG. 2A, is a metallic film. This would be instead of depositing a dielectric film for pore sealing. When the metallic film itself is used as a pore sealing material, that outgassing from the pores of the material layer will act to prevent the metallic film gases and materials from entering the pore structure which would damage the low-K nature of the dielectric material. In this embodiment, the thin film is a metallic film defined from one of a tantalum nitride (TaN), a titanium nitride (TiN), or a tungsten nitride (WN). When the metallic film is used for pore sealing, the metallic film is formed via a chemical process implementing a chemical vapor deposition (CVD) or atomic layer deposition (ALD).

Figure 2B:
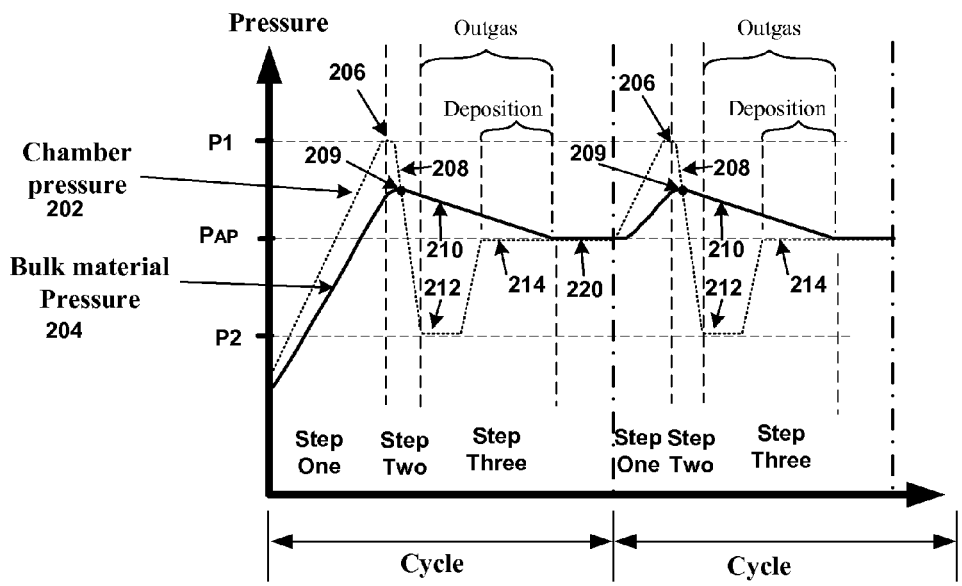

FIG. 2B illustrates an example where additional cycles can be processed in order to deposit additional thin film layers. The additional thin film layers may be of the same material needed to perform the pore sealing method, or can be used for depositing different materials in different cycles. In the example shown, point 220 will be reached depending on the slope 210, which is dictated by the pore structure of the material layer being processed. If the outgassing is a slower process, the slope 210 will take longer to reach the average processing pressure, which could provide for a longer duration of deposition. For other materials, the slope 210 may be steeper which would reduce the deposition time.

As mentioned above, multiple cycles can be repeated in order to achieve the thickness desired during the available deposition time. As described herein, the available deposition time is the time preferably when the bulk material is outgassing from the open pores so that the pore sealing thin film can seal the pores without penetrating substantially into the pore structure. In some embodiments, an initial pore sealing when the outgassing is more active can act to block substantially all of the pores that are open or a majority of the larger pores. In such a case, the deposition process can be extended past the time when outgassing has substantially discontinued. For example, the deposition can occur during point 214 and at least part of 220.

In the embodiment shown in FIG. 2B, the next cycle begins in step one, where the chamber pressure 202 is again raised to point 206 (P1), followed by lowering the chamber pressure 202 to a second pressure (P2) at point 212 during step two. And then followed by step three, where the outgassing begins and the chamber pressure 202 is brought back to the average processing pressure to enable deposition while simultaneously causing outgassing from the open pore structures, to affect the pore sealing method.

Figure 3A:
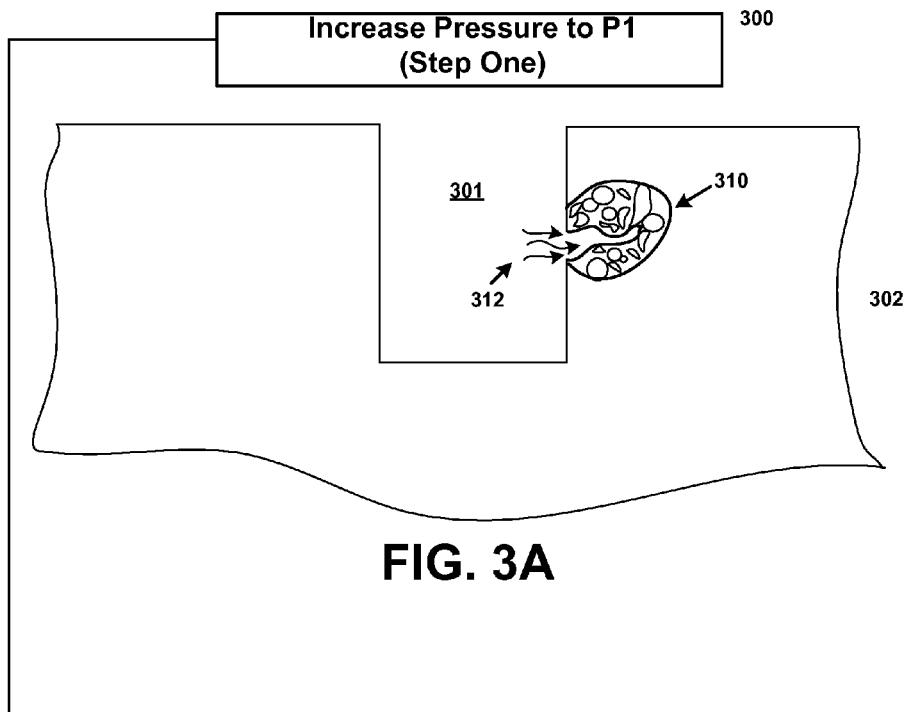
FIGS. 3A-3C illustrate example cross-sections of a material layer with example open pores as well as gas in-flux and out-flux from the pores due to pressure changes, in accordance with an embodiment.

FIG. 3A illustrates an example cross-section of a material layer 302, having a porous structure 310, in accordance with one embodiment. In this illustration, the material layer 302 has a feature 301 defined therein. The feature 301 is an etched feature, such as one utilized for a trench in a semiconductor integrated circuit, wherein metallic lines are formed. Although not shown, other features typically etched into material layer 302 may include via holes, such as those formed in a dual Damascene process.

For illustration purposes, the pore structure 310 is shown having one pore that is open to the sidewall of the feature 301. In actual pore structures, a majority of the walls and bottom surfaces of the features will have open pores, which are a result of the etching process that cuts into the material layer 302 (e.g., during photolithography and etching processes). The single pore shown in the pore structure 310 is only shown to illustrate that some pores make interconnect with a pore structure and thus provide pathways deep into the material layer 302. As mentioned above, the material layer 302 may be a low-K dielectric material. A material that is low-K is typically referred to as having a K value that is less than 4, which is typically the dielectric constant of silica dioxide. The K value of air is 1, and therefore a low-K dielectric typically has a range that is less than 4 and greater than 1.

As shown in FIG. 3A, a cyclic method is performed when the material layer 302 (which is part of a substrate or layer on a substrate) is placed in a chamber for chemical processing and the pressure of the chamber is increased to a first pressure (P1), which is higher than the average thin film deposition pressure. The increasing pressure is in one embodiment performed by also filling the process chamber with an inert gas. The inert gas introduced into the process chamber is in one embodiment selected to be neutral to the deposition film to be deposited during pore sealing methods. The increase in the pressure will therefore cause an injection of the inert gas into the open pores of the material layer 302.

Again, although only a single pore is shown for purposes of example, many pores would be present along the walls of the feature 301 and other features etched into the material layer 302 across a semiconductor substrate (e.g. silicon wafer having one or more material layers formed thereon). As mentioned above, the elevated pressure P1 will be selected and the amount of time during which the elevated pressure P1 is maintained, depending on the pore structure of the material layer 302. Once a sufficient amount of time and pressure has been applied to the processing chamber with the inert gas, and it is determined that a sufficient amount of inert gas has migrated into the open pores, the process moves to FIG. 3B.

Figure 3B:
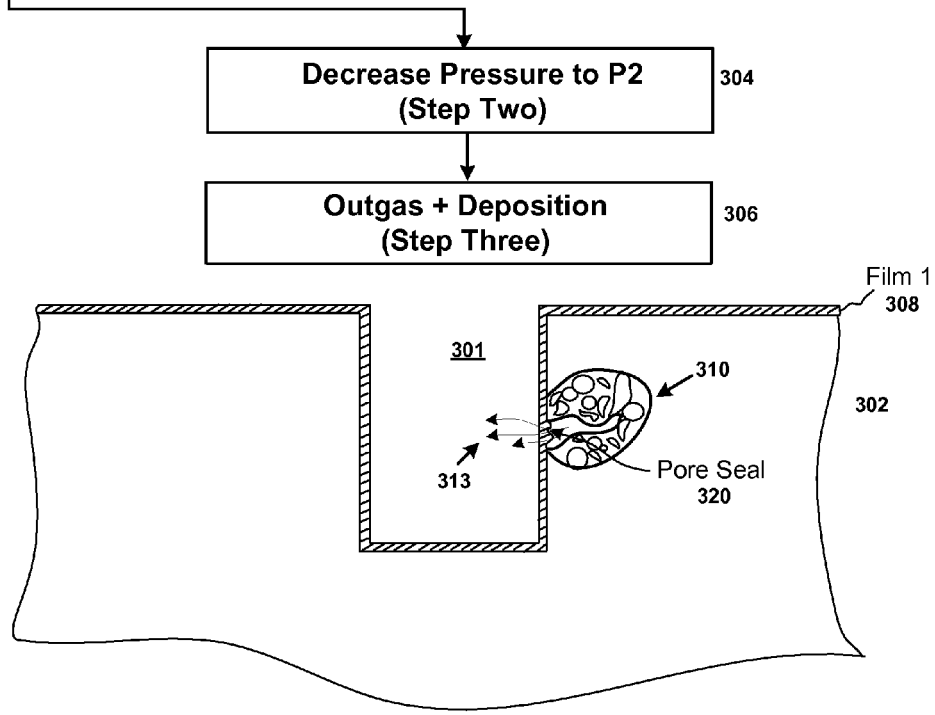

FIG. 3B illustrates that in operation 304 is performed to decrease the pressure to a second pressure (P2), which is lower than the average processing pressure for depositing a film. In one embodiment, the rate at which the pressure is decreased from P1 to P2 can be adjusted depending on the pore structure. When the pressure in the process chamber is at P2 or moves to P2, the pressure of the chamber will be below the pressure of the bulk material of the material layer 302. This means that gases within the material layer 302, e.g. the open pores, will begin to outgas. When the outgassing begins, or after a period of time after the outgassing begins, the pressure the chamber is moved to a deposition pressure for the film.

For example, the process chamber can be moved from pressure P2 to a slightly higher pressure. In another embodiment, the deposition pressure may be at the lower pressure P2 and therefore an elevation is not required. It should be understood that the pressure selected for depositing the film will depend on the film being deposited (e.g. a dielectric or metal for pore sealing). At this point in operation 306, while the outgassing is in progress, the method proceeds to deposit a film 1 (308) over the material layer 302. The deposition of film 1 will be occurring while the outgassing 313 is in progress from the open pores, which will assist in preventing the deposition vapors and deposition materials from entering or migrating into the pore structure via the open pores.

It is believed that while the outgassing is occurring, the deposition of the film 1 will occur substantially at the surface so as to seal the open pores while at the same time preventing unnecessary amounts of deposition films or gases from entering and damaging the pore structure of the material layer 302. As a result, the film 1 (308) will act as a pore seal 320 along the surface of the feature 301. This of course will also occur along all other open pores in the feature 301 and throughout the material layer 302, while the outgassing and deposition are ongoing. As further mentioned above, it is possible that complete pore sealing was not performed during the time that deposition was ongoing, while the outgassing occurred. It is also possible to continue deposition after the outgassing has terminated, so long as the deposition occurred or started while the outgassing was in progress. For instance, at the tail end of the deposition process or step during a cycle, the outgassing may be terminating but the substantial number of pores have been sealed. In such a case, the deposition process may continue past the time when the outgassing was occurring.

Figure 3C:
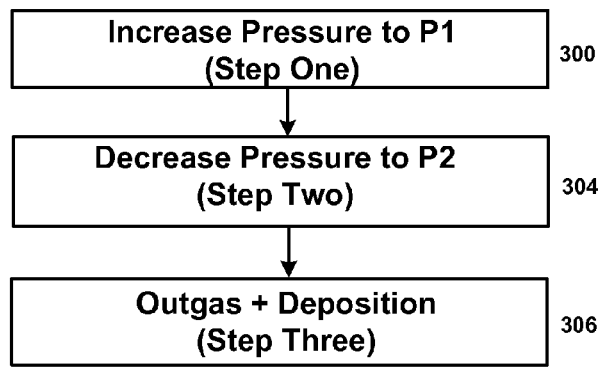
Figure 3C:
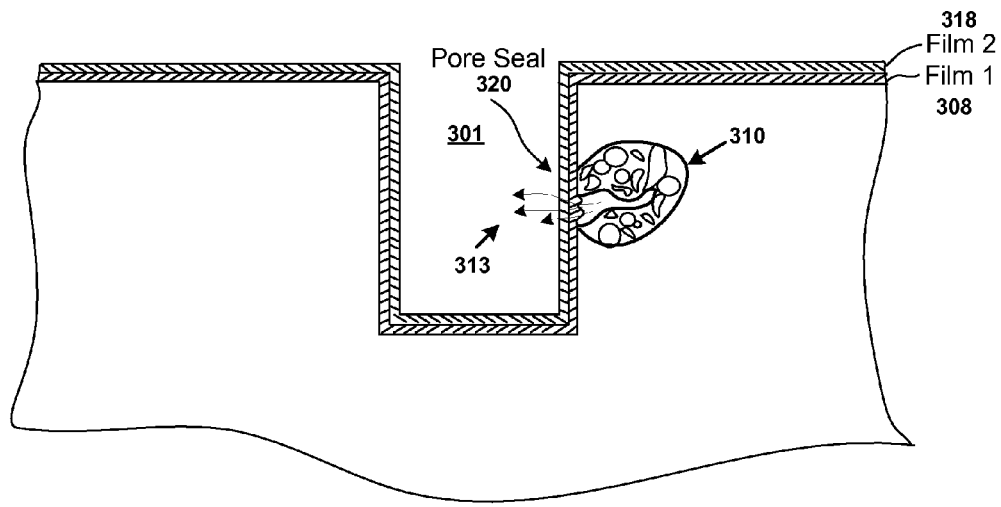

In another embodiment, it may be determined that the deposition process during one cycle did not provide a sufficient amount of thin film to complete the pore sealing method. In such a case, the method may include performing in another cycle (e.g. cycle 2 of N cycles) as shown in FIG. 3C. This example shows that operation 300, 304, and 306 may be repeated for the second cycle. During this time, a film to (318) may be deposited over the film one previously deposited in the first cycle. In some embodiments, each film may not uniformly cover the entire surface and therefore the illustration of the films 308 and 318 are only for purposes of illustration that to films can be deposited, one during each cycle.

As a result, the films will at some point reach the level of completely or substantially completely covering or sealing the pores, such as pore seal 320 in the feature 301. In one embodiment, an inspection step may be performed to determine if a sufficient amount of pore sealing has occurred before the next cycle is performed. In still another embodiment, previous experimentation data may be referred to in making a determination of how many cycles to perform and the thickness of the resulting film (e.g. the resulting film being the sum of film 1 and film 2).

As further mentioned above, the thin film 308 and 318 may be a metallic film, such as a tantalum nitride (TaN), a titanium nitride (TiN), or a tungsten nitride (WN). In other embodiments, the thin film 308 may be a dielectric used for pore sealing, and the thin film 318 may be a metallic material, e.g., such as a tantalum nitride (TaN), a titanium nitride (TiN), or a tungsten nitride (WN). In still other embodiments, once the pore sealing is complete, additional layers of metallic material, e.g., barrier layers, seed layers, tungsten fills, copper bulk fills, capping layers, etc., may be formed to define metallization lines in the feature 301 and via holes (not shown).

Figure 4:
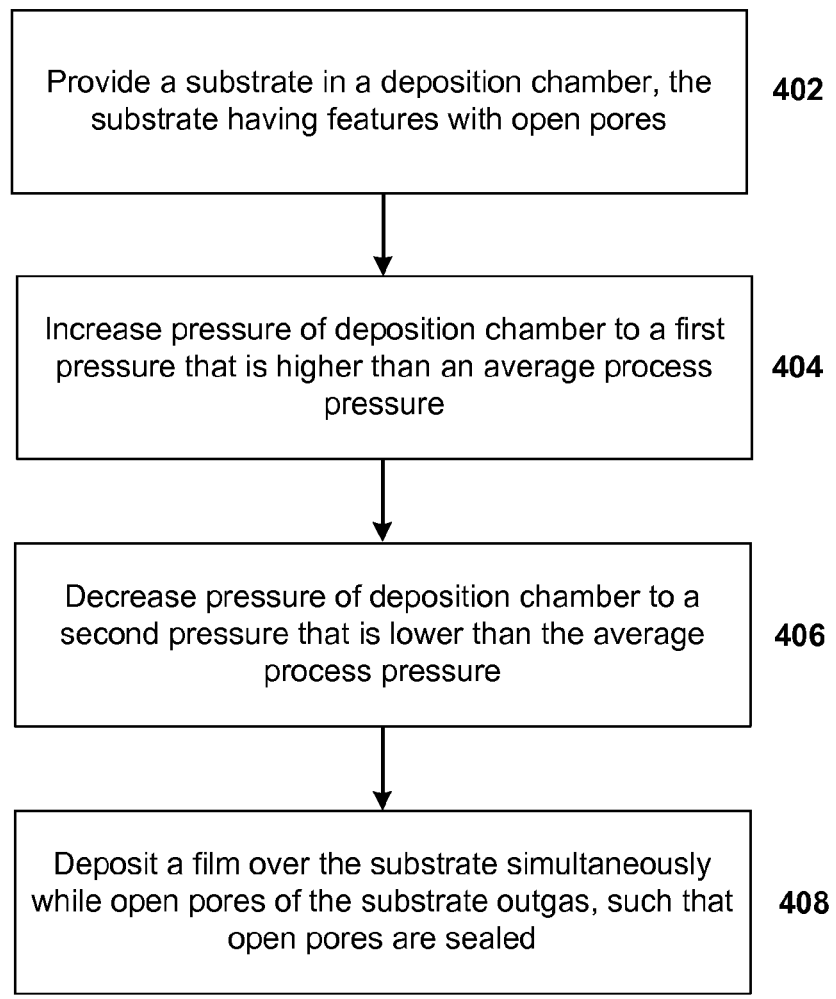
FIG. 4 illustrates a general process that can be utilized to perform pore sealing in a cyclical thin film deposition method.

FIG. 4 illustrates a general process that can be utilized to perform pore sealing in a cyclical thin film deposition method. Operation 402 includes providing a substrate in a deposition chamber where the substrate has features with open pores. The open pores are a result of etching features into the material layer, such as a porous dielectric formed over one or more layers of a semiconductor wafer. Operation 404 includes increasing the pressure of the deposition chamber to a first pressure that is higher than an average process pressure. In this example, the average process pressure would be the pressure for depositing the thin film. Depending on the type of thin film being deposited, that average processed pressure may be different.

Additionally, the higher pressure and amount of time during which the higher pressure is set will be based upon the pore structure, and the ability of the pore structure to absorb inert gas used to increase the pressure of the process chamber. During this elevated pressure stage, it is believed that the inert gas used to elevate the pressure will migrate or diffuse into the open pores of the pore structure. Once it is determined or calculated that a sufficient amount of inert gas has penetrated the open pores to change the pressure of the bulk material, the method moves to operation 406.

In operation 406, the pressure of the process chamber is decreased to a second pressure that is lower than the average process pressure used for depositing the thin film. The second pressure, in one embodiment is maintained for a period of time so as to influence outgassing to begin out of the bulk material via the open pores. Once the outgassing has begun, the process chamber pressure is moved to the average process pressure for depositing the thin film. As mentioned above, the average process pressure may be a pressure close to or at the second pressure or higher than the second pressure.

It is believed that while the outgassing continues, the thin film deposition can start and deposition will occur over the sidewalls and surfaces of the features, those sealing the pores or beginning the ceiling of the pores. If additional cycles are necessary to complete the pore sealing operation with the thin film, additional cycles may be repeated wherein the pressure may be elevated to charge the open pores and then decreased to allow outgassing while another deposition occurs. In some embodiments, the cycles are only repeated so long as open pores remain, otherwise the pores may not be charged with inert gas during the elevated charging of the pressure of the chamber.

Figure 5:
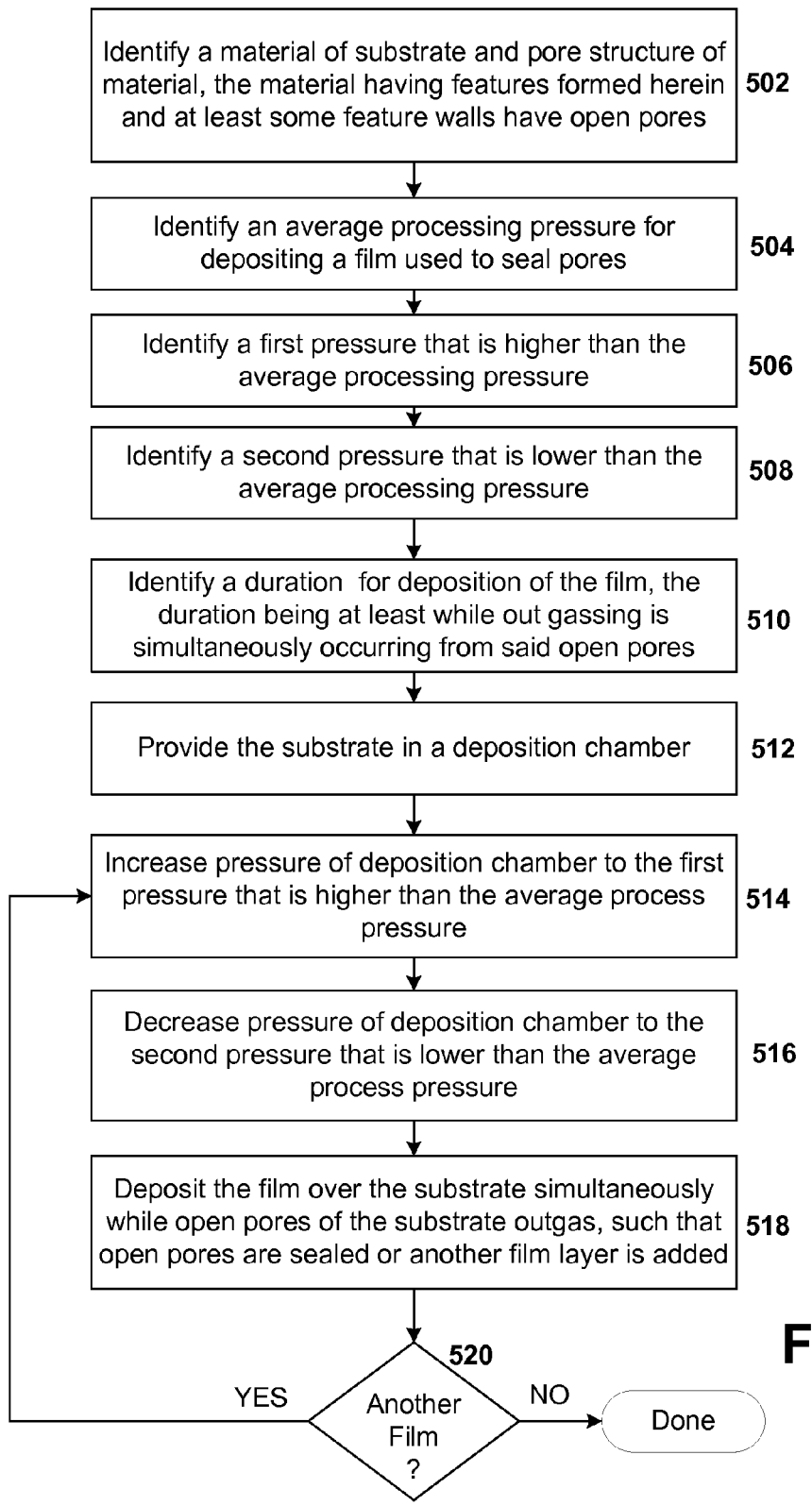
FIG. 5 illustrates another example method operation performed for pore sealing utilizing a thin film, wherein a cyclic deposition may be performed in accordance with one embodiment.

FIG. 5 illustrates another example method operation performed for pore sealing utilizing a thin film, wherein a cyclic deposition may be performed in accordance with one embodiment. In this example, operation 502 includes identification of a material of the substrate and pore structure of the material. The material will have features formed therein and at least some feature walls that have open pores. In some embodiments, in addition to identifying the type of pore structure, it is also possible to identify the amount of features formed on the surface of the wafer. For example, if more features are formed, more open pores will be present. Alternatively, if less open features are formed, fewer open pores will be present, even if the pore structure is dense in pores.

In operation 504, the average processing pressure is identified for depositing the type of film used to perform the pore sealing. Operation 506 identifies a first pressure that is higher than the average processing pressure which will be useful for pore sealing using the thin film over the material having the identified pore structure. In operation 508, a second pressure that is lower than the average processing pressure is identified. In operation 510, a duration for deposition of the film is identified. The duration of the film is preferably set to a period of time while outgassing is simultaneously occurring from the open pores. In operation 512, the substrate is provided into the deposition chamber.

As mentioned above, information regarding the material having the pore structure is identified in operation 502, which identifies or assists in identifying the first pressure and the second pressure and the duration at which the first pressure and the second pressure are maintained. The durations of application of the first pressure and the second pressure and the deposition time may be obtained from a look up table or a database. The database may include a plurality of previous tests that categorize and characterize target pressures and times for the first pressure in the second pressure and the deposition times for particular cycles, based on the type of pore structure and the amount of open features in the material layer having the pore structure.

In operation 514, the pressure in the deposition chamber is increased to the first pressure that is higher than the average processing pressure. In operation 516, the pressure of the deposition chamber is decreased to a pressure that is lower than the average processing pressure. In operation 518, a film is deposited over the substrate simultaneously while open pores of the substrate out gas. In one embodiment, the open pores are sealed using the film or after multiple film layers are formed in one or more cycles. Operation 520 includes a determination as to whether another film is required. If another film is required during another cycle, the method returns to operation 514. If the thickness of the film is determined to be sufficient for sealing the pores, the method will end.

Figure 6:
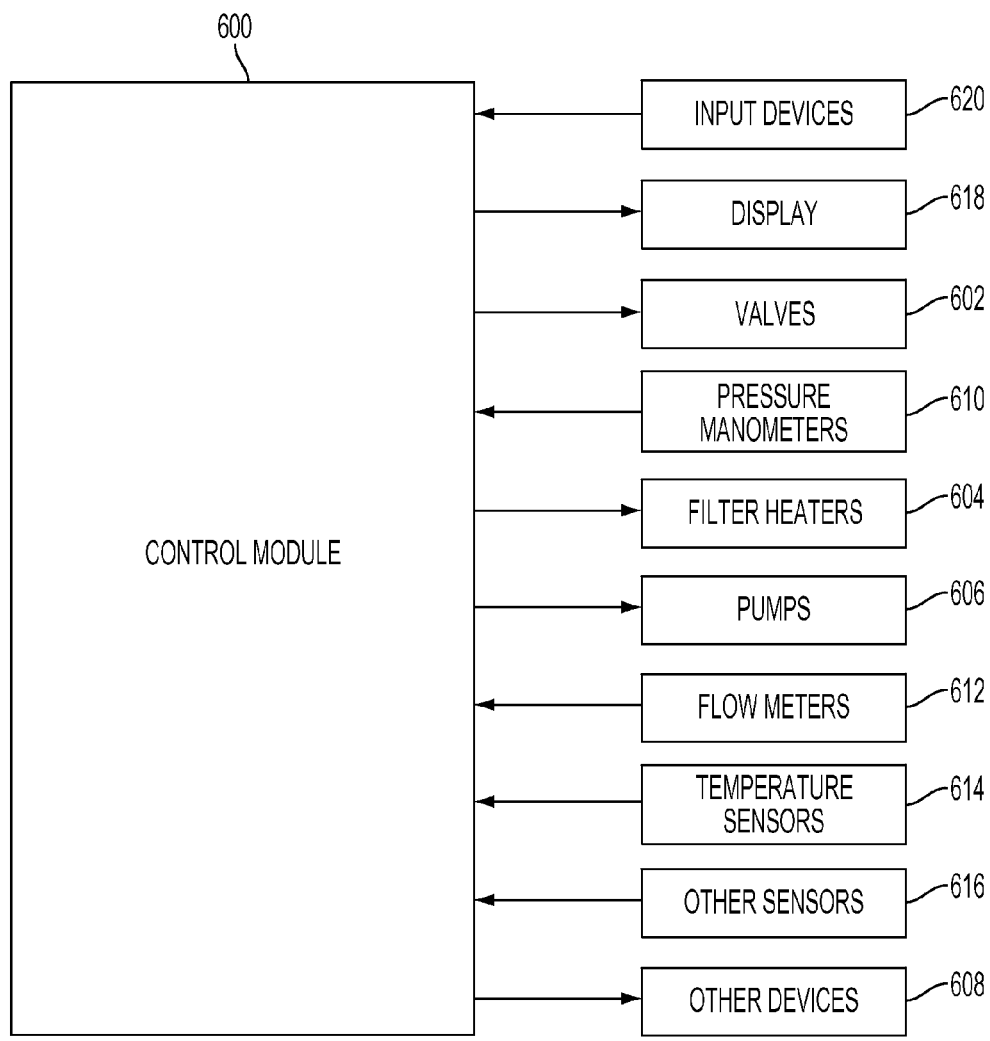
FIG. 6 shows a control module for controlling the systems, in accordance with one embodiment.

FIG. 6 shows a control module 600 for controlling the systems described above. In one embodiment, the control module 110 of FIG. 1 may include some of the example components. For instance, the control module 600 may include a processor, memory and one or more interfaces. The control module 600 may be employed to control devices in the system based in part on sensed values. For example only, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during precursor delivery and deposition of the film. The control module 600 will typically include one or more memory devices and one or more processors.

The control module 600 may control activities of the precursor delivery system and deposition apparatus. The control module 600 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 600 may also monitor the pressure differential and automatically switch vapor precursor delivery from one or more paths to one or more other paths. Other computer programs stored on memory devices associated with the control module 600 may be employed in some embodiments.

Typically there will be a user interface associated with the control module 600. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A method for processing a substrate using a plasma chamber, comprising,
   (a) providing the substrate on a pedestal of the plasma chamber, the substrate having a material layer that has a porous structure and a least one feature formed in the material layer that exposes one or more open pores of the porous structure;
   (b) introducing an inert gas into the plasma chamber so that a pressure of the plasma chamber is increased to a first pressure that is higher than an average process pressure used for depositing a thin film, wherein increasing to the first pressure causes at least some of the inert gas to migrate into the one or more open pores of the porous structure of the material layer;
   (c) decreasing the pressure of the plasma chamber to a second pressure that is lower than the average process pressure used for depositing the thin film, wherein decreasing the pressure to the second pressure causes at least some of the inert gas in the material layer to outgas from the one or more open pores; and
   (d) processing the deposition of the thin film over the material layer and the feature formed in the material layer simultaneously while the inert gas outgases from the one or more open pores of the material layer, wherein the thin film is configured to seal the one or more open pores while the inert gas outgases.

2. The method of claim 1, wherein the thin film is a metallic film for sealing the one or more open pores, the method further comprising,
   repeating operations (b), (c) and (d) one or more additional cycles, wherein each cycle produces the thin film so that a thickness of two or more thin films is deposited to seal the one or more open pores in the feature of the material layer.

3. The method of claim 1, wherein the material layer is a low-K dielectric material, and the one or more pores are distributed throughout the material layer.

4. The method of claim 1, wherein the material layer is silicon oxycarbide (SiOC).

5. The method of claim 1, wherein the thin film is a dielectric film for sealing the one or more open pores; and the method further comprising, depositing a metallic film over the dielectric film, the metallic film being deposited using one of a physical vapor deposition (PVD) method, a chemical vapor deposition (CVD) method or atomic layer deposition (ALD) method, wherein the metallic film is deposited after the one or more pores have been sealed by the dielectric film.

6. The method of claim 2, wherein the metallic film is one of a tantalum nitride (TaN), a titanium nitride (TiN), or a tungsten nitride (WN).

7. The method of claim 6, wherein the metallic film is formed via a chemical process implementing a chemical vapor deposition (CVD) or atomic layer deposition (ALD).

8. The method of claim 1, wherein the porous structure of the material layer defines a level of hydraulic resistance to absorbing the inert gas during the increase of the pressure to the first pressure, the level of hydraulic resistance defining an amount of time during a period of increasing the pressure to the first pressure and an amount of increase beyond the average process pressure.

9. The method of claim 1, wherein the porous structure of the material layer defines a rate of outgassing of the inert gas during the decrease of the pressure to the second pressure, the rate of outgassing determining a rate at which the pressure decreased and amount of time when outgassing is active, wherein the deposition of the thin film over the material layer is enabled substantially simultaneously while the outgassing is active.

10. The method of claim 9, wherein enabling the deposition of the thin film over the material layer substantially simultaneously while the outgassing is active acts to substantially block material of the thin film being deposited from depositing or migrating into the one or more open pores.

11. The method of claim 10, wherein the outgassing pushes out the inert gas from the one or more open pores while the material of the thin film is being deposited, so that the seal of the one or more pores is enabled during the deposition of the thin film.

12. The method of claim 1, wherein the inert gas is one of argon or nitrogen.

13. The method of claim 1, wherein the increase the pressure and decrease of the pressure of the plasma chamber causes a respective and reactive increase and decrease in the material layer of the substrate, wherein the reactive increase and decrease of the pressure in the material layer has a lag behind the increase and decrease of the pressure in the plasma chamber, the lag being set by a hydraulic resistance of the material layer having a predefined pore structure.

14. The method of claim 13, wherein the lag changes for different types of pore structures, each different pore structure of material layers defines levels of the increase and decrease of the pressure of the plasma chamber, a duration during the increase in pressure to the first pressure, a duration during the decrease in pressure to the second pressure, and a duration of outgassing and corresponding duration of deposition of the thin film.

15. A method for processing substrate to seal pores of a material layer having a porous structure using a plasma chamber, comprising,
  (a) providing the substrate in the plasma chamber, the material layer having a feature therein that exposes open pores within the feature;
  (b) performing a deposition cycle, including,
    (i) introducing an inert gas into the plasma chamber so that a pressure of the plasma chamber is increased to a first pressure that is higher than an average process pressure used for depositing a thin film, wherein increasing to the first pressure causes at least some of the inert gas to migrate into the open pores of the porous structure of the material layer;
    (ii) decreasing the pressure of the plasma chamber to a second pressure that is lower than the average process pressure used for depositing the thin film, wherein decreasing the pressure to the second pressure causes at least some of the inert gas that migrated into the open pores of the material layer to outgas; and
    (iii) depositing the thin film over the material layer and in the feature formed in the material layer simultaneously while the inert gas outgases from the open pores of the material layer, wherein at least part of the thin film is configured to seal the open pores while the inert gas outgases;
  (c) repeating the deposition cycle of (b) one or more times so that one or more thin films are deposited in addition to the thin film, the one or more thin films acting to seal the open pores of the material layer.

16. The method of claim 15, wherein the material layer is silicon oxycarbide (SiOC) and the inert gas is one of argon or nitrogen.

17. The method of claim 15, wherein the thin film is a dielectric film for sealing the one or more open pores; and the method further comprising,
  depositing a metallic film over the dielectric film, the metallic film being deposited using one of a physical vapor deposition (PVD) method, a chemical vapor deposition (CVD) method or atomic layer deposition (ALD) method,
  wherein the metallic film is deposited after the one or more pores have been sealed by the dielectric film.

18. The method of claim 15, wherein the thin film is a metallic film for sealing the open pores, and the metallic film is one of a tantalum nitride (TaN), a titanium nitride (TiN), or a tungsten nitride (WN), and the metallic film is formed via a chemical process implementing a chemical vapor deposition (CVD) or atomic layer deposition (ALD).

19. The method of claim 15, wherein the porous structure of the material layer defines a level of hydraulic resistance to absorbing the inert gas during the increase of the pressure to the first pressure, the level of hydraulic resistance defining an amount of time during a period of increasing the pressure to the first pressure and an amount of increase beyond the average process pressure.

* * * * *